United States Patent [19]

Moridi et al.

[11] Patent Number: 5,619,540
[45] Date of Patent: Apr. 8, 1997

[54] TRANSMISSION SYSTEM USING BLOCK-CODED OR TRELLIS-CODED MODULATIONS, RECEIVER AND DECODER FOR SUCH A SYSTEM

[75] Inventors: Saïd Moridi, Paris; Georges Martinez, Crosne, both of France

[73] Assignee: U.S. Philips Corporation, New York, N.Y.

[21] Appl. No.: 283,456

[22] Filed: Aug. 1, 1994

[30] Foreign Application Priority Data

Aug. 4, 1993 [FR] France .................... 93 09610

[51] Int. Cl.⁶ .................... H04L 27/06; H03D 1/00
[52] U.S. Cl. .................... 375/341; 375/222
[58] Field of Search .................... 375/265, 341, 375/261, 262, 222; 371/43

[56] References Cited

U.S. PATENT DOCUMENTS 5,384,810  1/1995  Amrang .................... 375/340

OTHER PUBLICATIONS

"Modulation Methods for STM-1 With 29.65 MHz Channel Separation", by Roste et al, 3rd ECRR, Paris, Dec. 17-20, 1991, pp. 89-96.

Primary Examiner—Stephen Chin
Assistant Examiner—Kevin Kim

[57] ABSTRACT

A decoder for a series of received digital signal samples which are encoded as points in a 2-dimensional constellation of points corresponding to authorized code values, which constellation is sub-divided into a plurality of subsets. The branch length $\mu$ between a received point and the closest authorized point in a subset is calculated as a function of the magnitude and sign of the error distance between the received point and the closest authorized point of the constellation, and of the displacement between successive authorized points in the subsets. It is thus possible to determine branch length without calculation of squared values and without employing any approximations.

5 Claims, 5 Drawing Sheets

TRANSMISSION SYSTEM USING BLOCK-CODED OR TRELLIS-CODED MODULATIONS, RECEIVER AND DECODER FOR SUCH A SYSTEM

BACKGROUND OF THE INVENTION

The invention relates to a transmission system using block-coded or trellis-coded modulations based on a 2-dimensional QAM constellation divided into N sub-sets, and comprising a transmitter and a receiver which is provided with a decoder for decoding said modulations, which decoder comprises a module capable of calculating a distance between each received sample and the point which is closest thereto in each sub-set of the two-dimensional constellation.

Such a decoder renders it possible to decode a sequence of samples received through a channel with noise and resulting from convolutional coding or block coding of a sequence of items of information to be transmitted. The behaviour of a convolutional encoder is described by a trellis in which each transition between two states corresponds to the transmission of one point of the constellation, which is divided into sub-sets such that the distance between two points of a sub-set is greater than the distance which separates two points of the original constellation.

The Viterbi algorithm is known to be an optimum decoding method for convolutional codes. The principle of a Viterbi decoder is described in the article "The Viterbi Algorithm" by G. David Forney, published 3 Mar. 1973 in "Proceedings of the IEEE". Briefly, it may be noted that decoding by means of a Viterbi decoder involves the following three steps:

For each sample of the ing sequence of two-dimensional samples of the recessed signal, that authorized point is to be found which is closest to said sample in each of a series of N sub-sets of the two-dimensional constellation. The branch lengths associated with sample are accordingly calculated on the basis of these N distances. Subsequently, the authorized sequence is to be found which is closest to the sequence of received samples received, i.e. that authorized sequence of which the path length (which is equal to the sum of the branch lengths which make up this path) is smallest.

Finally, the sequence of bits corresponding to the authorized sequence having this shortest path is to be found by means of the trellis.

In principle, the calculation of the branch lengths involves the use of the squared euclidian distance. This calculation of squared values is complicated and requires a high number of bits for its representation. A sufficiently fast memory is not available for certain applications, in particular in the field of hertzian beams where the data rates are very high. It is therefore necessary to simplify the calculation of the branch lengths so as to render possible installations without memory for the Viterbi algorithm. It is known, for example, to use the Manhattan Distance which replaces the sum of squares with a sum of absolute values, as disclosed in the proceedings of the third ECRR (European Conference on Radio Relay systems), edited by Terje Roste and Jonny Normann Skalvik, held in Paris from 17 to 20 Dec. 1991. However, this Manhattan distance has the following disadvantage: when the points received are situated at the boundary of the constellation, the distances thus obtained are subject to errors.

SUMMARY OF THE INVENTION

The present invention has for its object to provide a simple means for calculating the branch lengths with the minimum number of bits necessary, without approximation, thus rendering possible memoryless installations of the Viterbi decoder.

To achieve this object, a transmission system according to the invention, and as described in the introductory paragraph, is characterized in that the distance $\mu$ used for branch length is a relative distance given by the following function $\Im$.

$$\mu = \Im[|\Delta_i|, \text{sgn}(\Delta_i), \text{sgn}(E_i), |E_i|]$$

in which
the index i indicates that this is the abscissa (i=x) or the ordinate (i=y) of the quantity indicated,
$|\Delta_i|$ represents the displacement between any two successive points of the constellation,
$E_i$ is the abscissa or ordinate error distance, using the same index as for $\Delta_i$, between the point received and the authorized point which is closest thereto in the two-dimensional constellation,
sgn() indicates the sign function.

In a particularly advantageous realisation, the relative distance $\mu$ used is calculated from an expression of the type:

$$\bar{\mu} = \sum_{i=x,y} |\Delta_i| \cdot (|\Delta_i| - \text{sgn}(\Delta_i) \cdot \text{sgn}(E_i) \cdot |E_i|)$$

In a first embodiment, the relative distance $\mu$ is obtained through the calculation of expressions of the type:

$$n \cdot (n \pm |E_i|)$$

in which n is a natural integer whose value, related to the subdivision of the constellation used, remains small.

All squaring has thus been eliminated here, without the introduction of an approximation, and has been replaced with a multiplication by a natural integer of small value, which is very simple to achieve.

In a second embodiment, in which the original constellation is subdivided into at most eight sub-sets, the relative distance $\mu$ is obtained through calculation of expressions of the type:

$$(1 \pm |E_i|)$$

when $|\Delta_i|$ is equal to 1, and through calculation of expressions of the type $$(2 \pm |E_i|)$$

followed by a shifting of the result towards the bits of greatest weight when $|\Delta_i|$ is equal to 2.

Thus it is not necessary to use any multiplier or even any adder for this calculation step.

The invention also relates to a receiver for a transmission system as described above and to a decoder designed for use in such a receiver.

BRIEF DESCRIPTION OF THE DRAWING

Other particulars, details and advantages of the invention will become clear from the following description with reference to the annexed drawings, all given by way of non-limitative example, wherein.

DESCRIPTION OF THE PREFERRED EMBODIMENTS

In the following description, a four-dimensional constellation will be considered. This constellation A0×A0 is an assembly of pairs of points each belonging to a two-dimensional constellation A0 (we note that a product assembly A×B is defined by the cartesian product of the assembly A by the assembly B, i.e. that it is the assembly of the pairs (x,y) in which x∈A and y∈B) such that the transmission of a point of the constellation A0×A0 corresponds to the transmission of two consecutive points of the constellation A0. Thus the subdivision of the constellation A0×A0 is based on that of the constellation A0.

Figure 1:
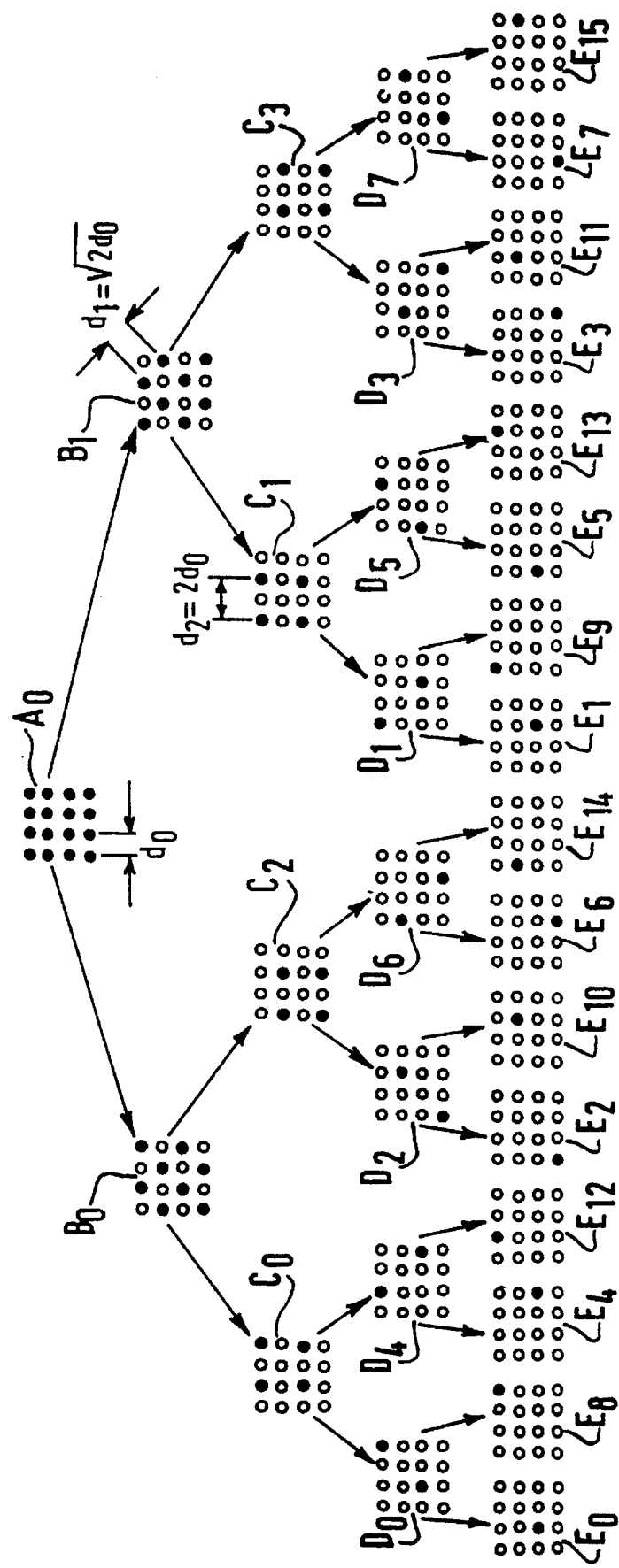
FIG. 1 shows the different possible subdivisions of a two-dimensional QAM16 constellation.

FIG. 1 shows the various possible subdivisions A, B, C, D and E of a two-dimensional QAM16 constellation. The original constellation A0 is formed by points interspaced by distances $d_0$. In a first step, it is divided into two sub-sets B0 and B1 whose points are interspaced by distances $d_1 = \sqrt{2}d_0$. In a second step, subsequently, each sub-set B0 and B1 is in its turn divided into two sub-sets C0 and C2 on the one hand and C1 and C3 on the other hand, such that two points of a sub-set C are interspaced by a distance $d_2 = 2d_0$. The sub-sets C are again divided each into two sub-sets, thus forming a subdivision D formed by eight sub-sets of two points interspaced by a distance $d_3 = 2 \cdot \sqrt{2}d_0$. Finally, each sub-set D is in its turn divided into two sub-sets forming a subdivision E, which comprises 16 sub-sets each containing a single point.

The ensuing description will deal with the subdivision C.

Figure 2:
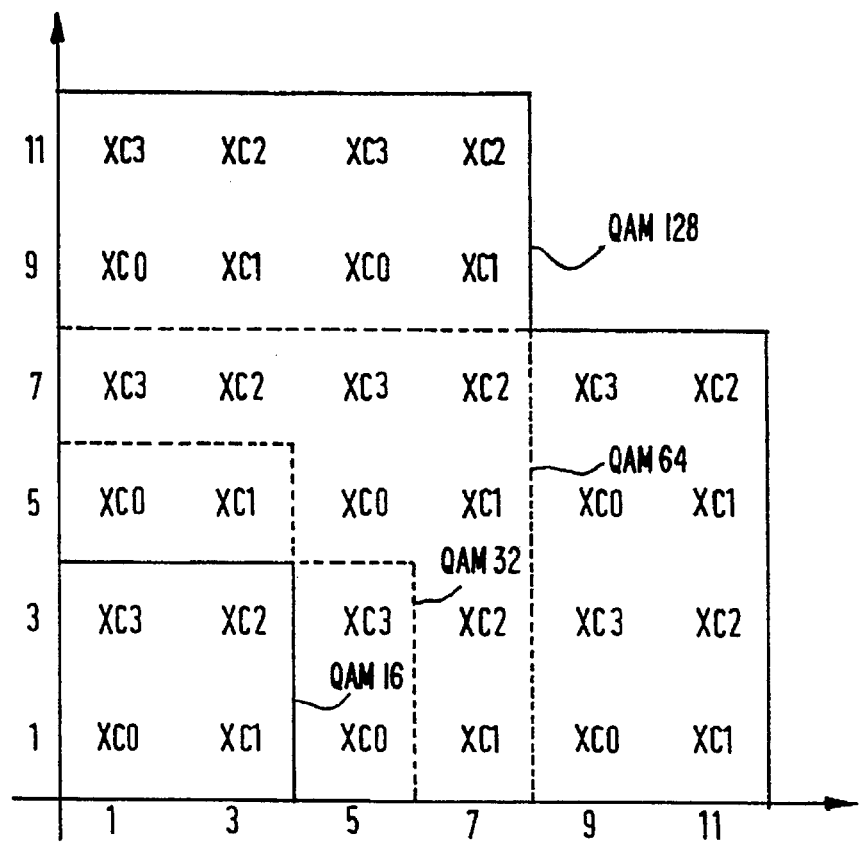
FIG. 2 shows the positive quadrant of the four constellations QAM 16, 32, 64 and 128.

FIG. 2 shows the positive quadrant of each of four two-dimensional constellations QAM 16, 32, 64, 128, indicating to which of the four sub-sets C0, C1, C2 and C3 each of the points belongs. When we consider the window formed by the four points of the QAM16 constellation, the points with coordinates (1,1), (3,1), (3,3) and (1,3) belong to the sub-sets C0, C1, C2 and C3, respectively. When we enlarge this window by a distance $2d_0$ parallel to the abscissa or the ordinate, the same diagram will be found for the other constellations. The other quadrants of the system may be readily deduced from the positive quadrant by rotation through a multiple of π/2.

The subdivision of the constellation A0×A0 into eight sub-sets numbered L0 to L7 then follows from the subdivision of the constellation A0 in the following way:

L0=C0×C0∪C2×C2,

L4=C0×C2∪C2×C0,

L2=C1×C1∪C3×C3,

L6=C1×C3∪C3×C1,

L1=C0×C3∪C2×C1,

L5=C0×C1∪C2×C3,

L3=C1×C0∪C3×C2,

L7=C1×C2∪C3×C0,

In which the symbols × and ∪ indicate the cartesian product and recombination of the two sets, respectively.

Figure 3:
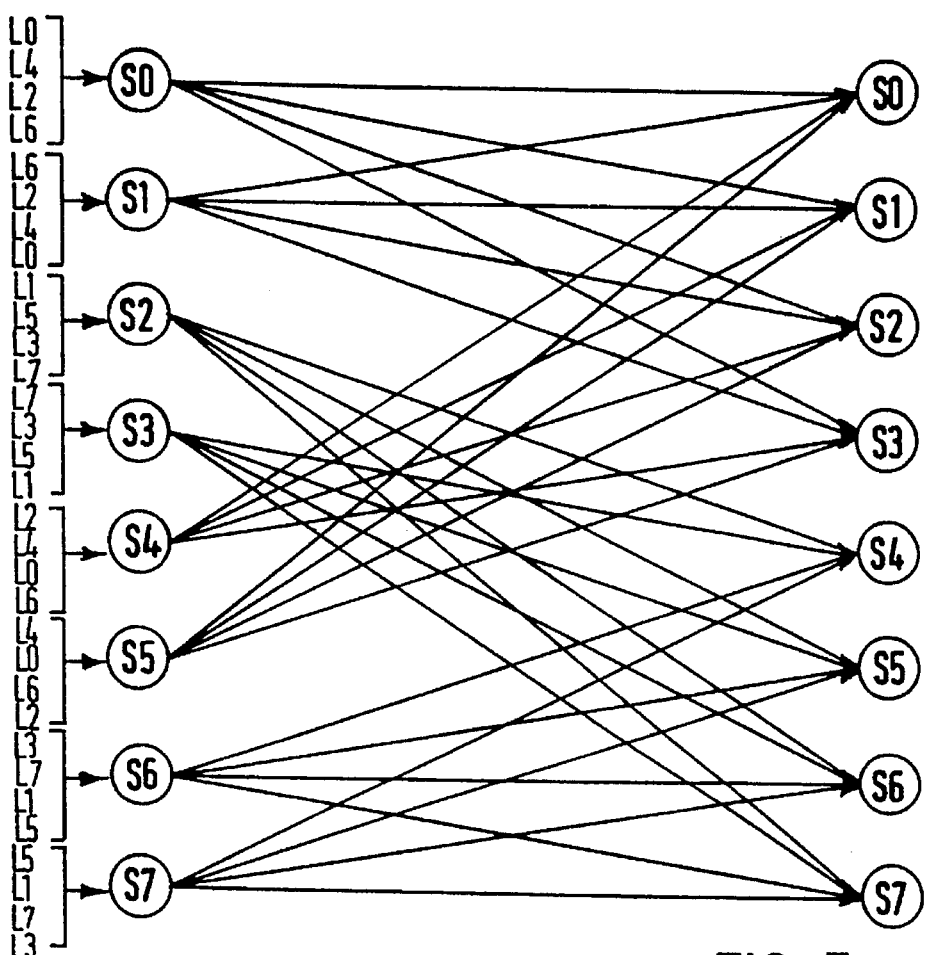
FIG. 3 is an example of a trellis of eight states which will be used in the ensuing description.

FIG. 3 shows the trellis used in the following description. This is an eight-state trellis numbered S0 to S7 which enables four transitions from each state, represented by arrows in the Figure. The passage from one state to another corresponds to the transmission of a four-dimensional point belonging to one of these eight sub-sets L0 to L7. It is thus possible to achieve the states of S0, S1, S2 or S3 from the states S0, S1, S4 and S5 by transmitting a respective point of the sub-sets L0, L4, L2 or L6; L6, L2, L4 or L0; L2, L4, L0 or L6; and L4, L0, L6 or L2, respectively. Similarly, it is possible to achieve the states S4, S5, S6 or S7 from the states S2, S3, S6 and S7 by transmitting a point of the sub-set L1, L5, L3 or L7; L7, L3, L5 or L1; L3, L7, L1 or L5; and L5, L1, L7 or L3, respectively.

Figure 4:
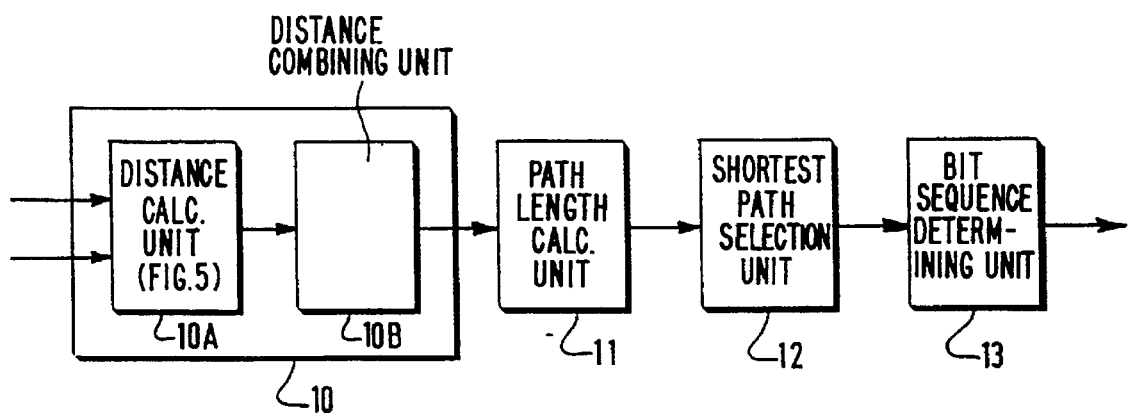
FIG. 4 is a block diagram of the operation of an example of a decoder which is to be used in a receiver with a transmission system according to the invention.

FIG. 4 is a block diagram of an example of a decoder according to the invention capable of decoding a convolutional code described by such a trellis in optimum manner. This decoder comprises a first block 10 composed of two blocks 10A and 10B.

The block 10A is capable of calculating the four distances associated with each of the two two-dimensional points which were received. The two sets of four distances which result therefrom are mutually combined by the block 10B so as to obtain the eight branch paths $\Lambda_0$ to $\Lambda_7$ associated with the corresponding four-dimensional point.

Let $\Lambda_{nj}$ be the distance between the $n^{th}$ point received and the point which is closest thereto in the sub-set Cj (n taking the values 1 and 2 so as to indicate that it relates to the first or second two-dimensional point received, while j takes the values 0, 1, 2 and 3, indicating that it relates to the distance relative to sub-set C0, C1, C2 or C3, respectively). The eight four-dimensional branch paths $\Lambda_0$ to $\Lambda_7$ are then obtained from the following equations:

$$\Lambda_0 = \min(\Lambda_{1,0} + \Lambda_{2,0};\ \Lambda_{1,2} + \Lambda_{2,2})$$

$$\Lambda_1 = \min(\Lambda_{1,0} + \Lambda_{2,3};\ \Lambda_{1,2} + \Lambda_{2,1})$$

$$\Lambda_2 = \min(\Lambda_{1,1} + \Lambda_{2,1};\ \Lambda_{1,3} + \Lambda_{2,3})$$

$$\Lambda_3 = \min(\Lambda_{1,1} + \Lambda_{2,0};\ \Lambda_{1,3} + \Lambda_{2,2})$$

$$\Lambda_4 = \min(\Lambda_{1,2} + \Lambda_{2,2};\ \Lambda_{1,2} + \Lambda_{2,0})$$

$$\Lambda_5 = \min(\Lambda_{1,2} + \Lambda_{2,1};\ \Lambda_{1,2} + \Lambda_{2,3})$$

$$\Lambda_6 = \min(\Lambda_{1,3} + \Lambda_{2,3};\ \Lambda_{1,3} + \Lambda_{2,1})$$

$$\Lambda_7 = \min(\Lambda_{1,3} + \Lambda_{2,2};\ \Lambda_{1,3} + \Lambda_{2,0}).$$

The block 11 then calculates for each of the eight possible states (defined by the trellis of FIG. 3) the four path lengths corresponding to authorized transitions between two states. Only the shortest of these path lengths is retained, which involves a selection for each of the eight possible states at moment t+1 of the state at moment t of which the state at moment t+1 is the most probable result. For example, the four possibilities for resulting in state "0" at moment t+1 are the following:

being in state "0" at moment t and having transmitted a point of sub-set L0, being in state "1" at moment t and having transmitted a point of sub-set L6, being in state "4" at moment t and having transmitted a point of sub-set L2, being in state "5" at moment t and having transmitted a point of sub-set L4.

The path length retained accordingly is the following:

$$\Gamma_0(t+1) = min\ [\Gamma_0(t)+\Lambda_0;\ \Gamma_1(t)+\Lambda_6;\ \Gamma_4(t)+\Lambda_2;\ \Gamma_5(t)+\Lambda_4]$$

Then the block 12 allows us to select the shortest path length from among the eight which were calculated, and the block 13 finally finds the initial sequence of bits which corresponds to this shortest path, with the aid of the trellis, thus supplying at the output the most probable bit sequence originating from the transmitter.

Figure 5:
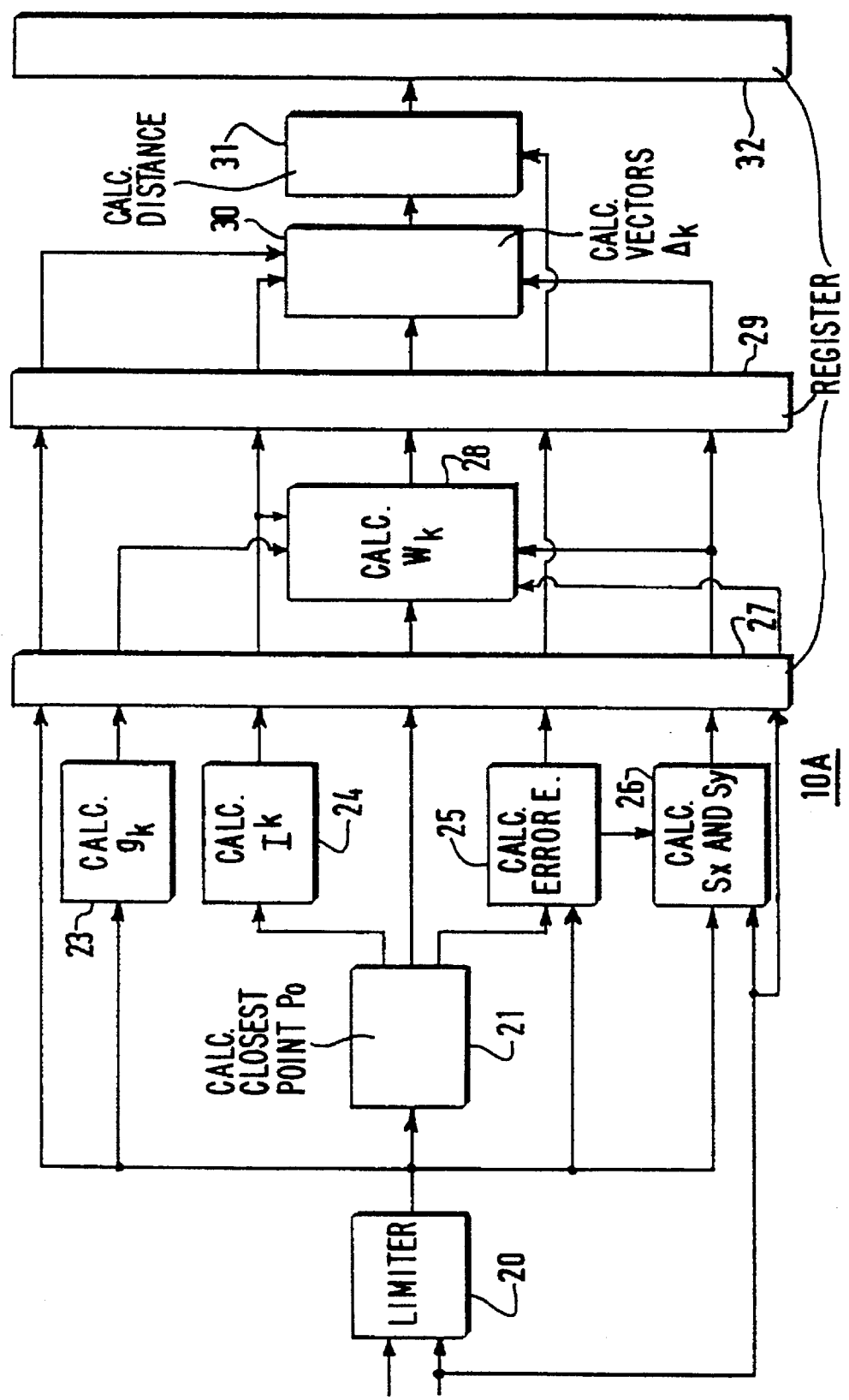
FIG. 5 is a block diagram of the operation of an example of the calculation module of such a decoder.

FIG. 5 shows in detail a calculation unit 10A according to the invention. This is a module which comprises a limiter 20 which receives at the input the coordinates X and Y of the two-dimensional points to be processed as well as a variable Q coded in two bits which indicate the format of the constellation used (16, 32, 64 or 128). This limiting module renders it possible to collect on the boundary of the constellation the received points which are outside it, and supplies at the output any possibly modified coordinates X' and Y' corresponding to a point R of the constellation. These coordinates are supplied to inputs of blocks 21, 23, 25 and 26. The block 21 calculates the coordinates of point $P_0$ of the constellation which is closest to the received point R. The result is transmitted to blocks 24 and 25:

the block 24 determines to which sub-set Ci this point $P_0$ belongs and derives therefrom the values of variables $I^k_X$ and $I^k_Y$ defined in the description below, and the block 25 calculates the error E which separates the received point R from the closest point $P_0$.

The blocks 23, 26 and 28 calculate intermediate variables ($g_k$, $\delta_X$ and $\delta_Y$, $W_k$, respectively, which will be defined below) necessary for the calculation of three displacement vectors $\Delta^k$ (in which k=1, 2 or 3) which render it possible, starting from the point $P_0$, to determine the three other neighbours $P_k$ of the received point R in each of the three other sub-sets of the constellation. The block 26 receives at its input not only the coordinates X' and Y', but also the variable Q and the error E of which it determines the sign.

The data coming from blocks 20, 21, 23, 24, 25 and 26 as well as the variable Q are stored in a first register 27 from which on the one hand the output data of the blocks 21, 23, 24, 26 and the variable Q are provided to the input of block 28, and on the other hand the dam coming from the blocks 20, 24, 25, 26 and 28 are stored in a second register 29. The dam coming from the blocks 20, 24, 26 and 28, available in register 29, are subsequently provided to the input of block 30 which calculates the three displacement vectors $\Delta^k$. The output of block 30 is connected to the input of block 31 which also receives the error E from block 25, available in register 29, and calculates the distances between the received point and the tour closest points in the original constellation. The results are stored in a third register 32.

The calculation principle of the displacement vectors $\Delta^k$ is explained below. When the sub-set Ci to which the constellation point $P_0$ belongs has been determined, which point is closest to the received point R the displacement is sought which renders it possible to determine the point $P_k$ closest to the received point R in the sub-set Cj (with j=0, 1, 2 or 3 and j≠i).

It is necessary for this purpose to know which coordinate (abscissa and/or ordinate) is to be incremented as a function of the source (Ci) and destination (Cj) sub-sets. To pass from the source sub-set C0 to the destination sub-sets C1, C2 and C3 for example, it is necessary to increment the abscissa, the abscissa and the ordinate, and the ordinate of the closest point $P_0$, respectively Two bits $I^k_X$ and $I^k_Y$ are thus defined, each indicating whether the abscissa and the ordinate of the point $P_0$ must be incremented or not for passing from the point $P_0$ to each of the three points $P_k$. These two bits are determined in the following manner by the block 24:

$$I^k_X = b^1_s \oplus b^1_d \beta b^0_s \oplus b^0_d$$

$$I^k_Y = b^1_s \oplus b^1_d$$

in which ($b^1_s$, $b^0_s$) and ($b^1_d$, $b^0_d$) are the respective binary values of the indices (0, 1, 2, or 3) of the source sub-set and of the $k^{th}$ destination sub-set, and in which the symbol $\oplus$ indicates the "EXCLUSIVE OR" operation.

The calculation of the displacement vector $\Delta^k$ then requires a distinction between several cases depending on the shape of the constellation and the zone of the constellation in which the R received point is situated. In fact, the general principle of calculating the displacement vector $\Delta^k$ consists in that a displacement is carried out in the direction of the error E. Two exceptions, however, should be taken into account. First, for the extreme points of the constellation, the direction of displacement must be reversed so as not to pass outside the constellation. Second, the constellations 32 and 128 are not square, and certain virtual points could be obtained as the closest points according to the general principle of estimating the displacement. In this case, the initial estimation must be modified.

Figures 6A, 6B:
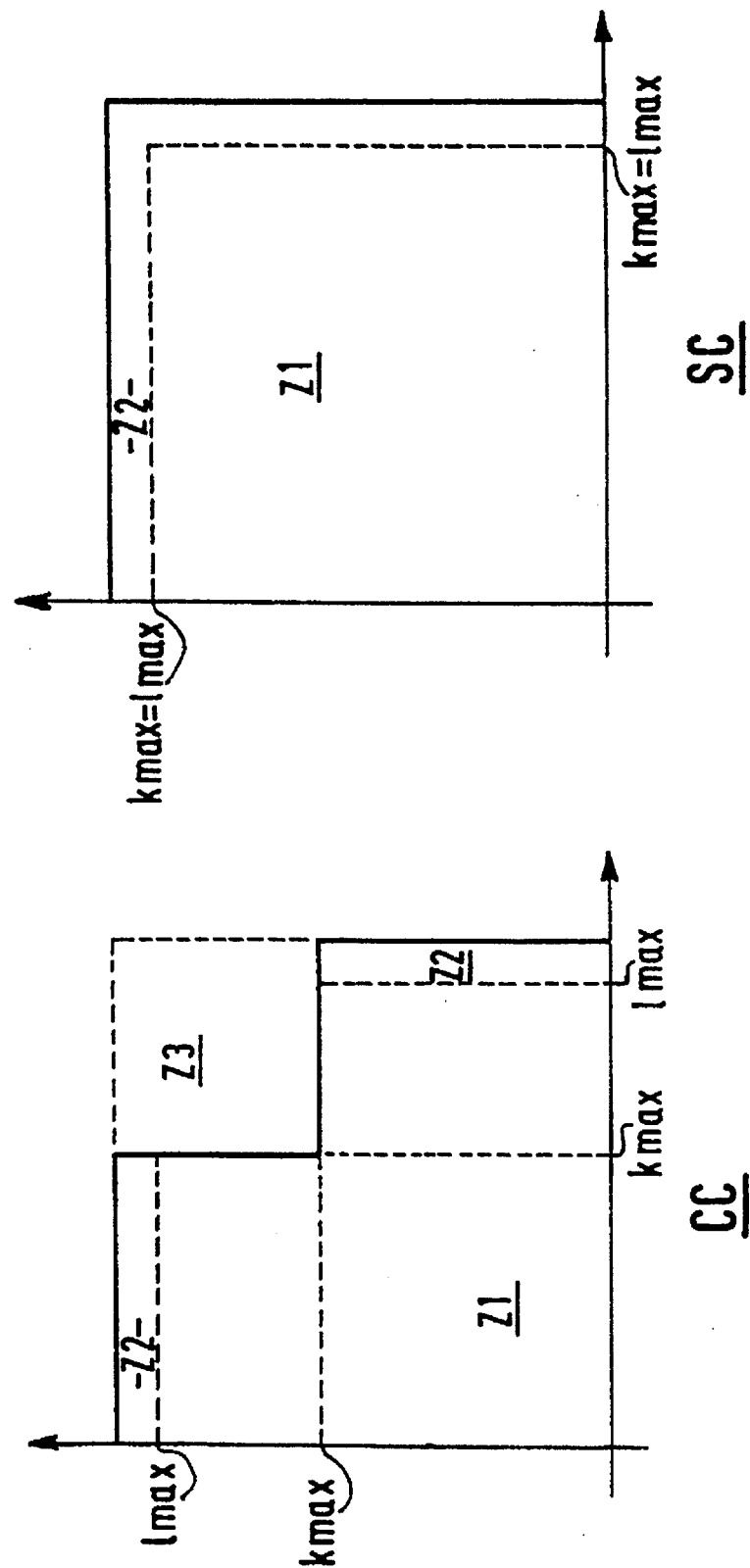
FIG. 6 is a diagram showing different zones of a cross constellation and a square constellation used for calculating displacement vectors.

The various cases which are to be taken into account are shown in FIG. 6 for the positive quadrant of the plane. In case CC of a cross constellation, three zones are to be distinguished. The third zone Z3 is that which extends the cross constellation so as to make it into a square. The second zone Z2 comprises all other points situated at the boundary of this square. The remainder of the points of the constellation form the first zone Z1. In the case SC of a square constellation, accordingly, the constellation is formed by the two first zones Z1 and Z2 only.

Two new quantities are defined in this Figure as well: these are 1max which is the upper limit of the abscissae and the ordinates of the points of the constellation (the boundary of the constellation is thus determined by the straight lines defined by X=1max+1 and Y=1max+1), and kmax which is the upper limit of the abscissae and the ordinates of the points of the square portion of the constellation. For square constellations, the quantities 1max and kmax are accordingly the same.

When the received point R belongs to the first zone Z1, the displacement $\Delta^k$ has a direction equal to that of the error E:

$$\Delta^k_X = I^k_X \cdot sgn(E_X)$$

$$\Delta^k_Y = I^k_Y \cdot sgn(E_Y)$$

When the received point R belongs to the second zone Z2, the direction of the displacement $\Delta^k$ is reversed compared with the preceding case:

$$\Delta^k{}_X = -I^k{}_X \cdot sgn(E_X)$$

$$\Delta^k{}_Y = -I^k{}_Y \cdot sgn(E_Y)$$

These two cases may thus be taken together into the following equation:

$$\Delta^k{}_X = h_X \cdot I^k{}_X \cdot sgn(E_X)$$

$$\Delta^k{}_Y = h_Y \cdot I^k{}_Y \cdot sgn(E_Y)$$

in which $h_X$ and $h_Y$ are variables defined by the following equations (I):

$$h_X = \begin{vmatrix} -1 \text{ if } |X| > l\text{max} \\ 1 \text{ elsewhere} \end{vmatrix}$$

$$h_Y = \begin{vmatrix} -1 \text{ if } |Y| > l\text{max} \\ 1 \text{ elswhere} \end{vmatrix}$$

The point of the constellation obtained by such a displacement (I) is written $\hat{P}_k$ in the following description.

However, when the point received R belongs to the third zone Z3, the displacement obtained according to the equations (I) is only a first estimation which is to be modified in accordance with the following equations (II) so as to obtain the points $P_k$:

$$\Delta^k{}_X = I^k{}_X \cdot h_X \cdot sgn(E_X) - 2 \cdot sgn(X) \cdot \overline{g_k} \cdot f(\hat{P}_k)$$

$$\Delta^k{}_Y = I^k{}_Y \cdot h_Y \cdot sgn(E_Y) - 2 \cdot sgn(Y) \cdot g_k \cdot f(\hat{P}_k)$$

in which the function f and the variables $g_k$ are defined as follows:

$$f(\hat{P}_k) = \begin{vmatrix} 1 \text{ if } \hat{P}_k \in Z3 \\ 0 \text{ elsewhere,} \end{vmatrix}$$

$$g_0 = \begin{vmatrix} 1 \text{ if } |X+1| > |Y+1| \\ 0 \text{ elsewhere} \end{vmatrix}$$

$$g_1 = \begin{vmatrix} 1 \text{ if } |X-1| > |Y+1| \\ 0 \text{ elsewhere} \end{vmatrix}$$

$$g_2 = \begin{vmatrix} 1 \text{ if } |X-1| > |Y-1| \\ 0 \text{ elsewhere} \end{vmatrix}$$

$$g_3 = \begin{vmatrix} 1 \text{ if } |X+1| > |Y-1| \\ 0 \text{ elsewhere} \end{vmatrix}$$

These variables $g_k$ indicate the position of the received point R in relation to the axes of symmetry of the two-dimensional sub-sets C0, C1, C2, C3, thus allowing a determination as to which is the closest point to R among the two possible points (point obtained by horizontal displacement or by vertical displacement relative to the first estimate $\hat{P}_k$). The factor sgn(X) or sgn(Y) used in the preceding equation renders possible a general application to the four quadrants of the plane.

The general expression of the displacement $\Delta^k$ in binary format is the following:

$$\Delta^k{}_X = I^k{}_X \cdot (1-2\delta_X) - 2W^k{}_X \cdot (1-2S_X)$$

$$\Delta^k{}_Y = I^k{}_Y \cdot (1-2\delta_Y) - 2W^k{}_Y \cdot (1-2S_Y)$$

with $$1-2S_X = sgn(X) \text{ et } 1-2S_Y = sgn(Y)$$

$$1-2\delta_X = h_X \cdot sgn(E_X) \text{ et } 1-2\delta_Y = h_Y \cdot sgn(E_Y)$$

$$W^k{}_X = f(\hat{P}_k) \cdot \overline{g_k} \text{ and } W^k{}_Y = f(\hat{P}_k) \cdot g_k$$

This renders it possible to encode the displacement $\Delta^k$ with three bits $\Delta 2$, $\Delta 1$ and $\Delta 0$ obtained as indicated below:

$$\Delta 2 = W \cdot \bar{S} + I \cdot \bar{W} \cdot \delta$$

$$\Delta 1 = \bar{I} \cdot W + I \cdot (W \oplus \delta)$$

$$\Delta 0 = I$$

$\delta$ is calculated by the block 26 from the coordinates of the received point R, from the value of lmax for the constellation used, and from the error E. W is calculated by the block 28 which evaluates beforehand the value of $f(\hat{P}_k)$ for cross constellations in the following manner:

let (b3, b2, b1, b0) be the binary value of a component of point $P_0$, then the value of $f(\hat{P}_k)$ for a QAM 32 constellation is given by the following calculation:

$$f_{32}(\hat{P}_k) = \bar{I} \cdot (\beta_2 + \beta_2) + I \cdot [\bar{\delta} \cdot (\beta_2 + \beta_1 + \beta_0) + \delta \cdot (\beta_2 + \overline{\beta_2} \cdot \beta_1 \cdot \beta_0)]$$

and for a QAM 128 constellation, it is given by the following calculation:

$$f_{128}(\hat{P}_k) = \bar{I} \cdot \beta_2 + I \cdot [\bar{\delta} \cdot (\beta_2 + \overline{\beta_2} \cdot \beta_1 \cdot \beta_0) + \delta \cdot \beta_2 \cdot (\beta_1 + \beta_0)]$$

with $$\beta_2 = b3 \oplus b2$$

$$\beta_1 = b3 \oplus b1$$

$$\beta_0 = b3 \oplus b0$$

$$\delta = b_3 \oplus \bar{\delta}$$

The following step carried out by block 31 consists in a calculation of the four distances by means of these displacement vectors $\Delta^k$. As explained in the preceding paragraphs, the closest points are:

$$P_k = P_0 + 2(\Delta^k{}_X, \Delta^k{}_Y)$$

in which $\Delta^k{}_X$ and $\Delta^k{}_Y$ may take the values 0, ±1, ±2 in the case of a subdivision C.

The euclidian distance $\mu_k$ between the received point R and the point $P_k$ of the sub-set Cj is thus written:

$$\mu_k = |R - P_k|^2$$

$$\mu_k = |R - P_0 - 2(\Delta^k{}_X, \Delta^k{}_Y)|^2$$

$$\mu_k = |(E_X, E_Y) - 2(\Delta^k{}_X, \Delta^k{}_Y)|^2$$

$$\mu_k = E_X^2 = E_Y^2 + 4\tilde{\mu}_k$$

with $$\tilde{\mu}_k = (\Delta^k_X)^2 + (\Delta^k_Y)^2 - (\Delta^k_X \cdot E_X + \Delta^k_Y \cdot E_Y).$$

It is this relative distance $\tilde{\mu}_k$ which is used by the calculation module according to the invention. It may alternatively be written in the following way:

$$\tilde{\mu}_k = |\cdot[|\Delta^k_X| - sgn(\Delta^k_X) \cdot sgn(E_X) \cdot |E_X|] + |\Delta^k_Y| \cdot [|\Delta^k_Y| - sgn(\Delta^k_Y) \cdot sgn(E_Y) \cdot |E_Y|].$$

which renders it possible to distinguish two cases:

if $|\Delta^k| = 1$ then it suffices to calculate the term $1 \pm |E|$, if $|\Delta^k| = 2$, then it suffices to calculate the term $2 \pm |E|$ followed by a shifting operation of the bits towards the strong weights. No multiplier or even adder is accordingly necessary for carrying out these operations.

In a practical embodiment of a decoder according to the invention, the error $E_X$, $E_Y$ has been coded with three bits, thus having for its extreme value $\pm 7/8$, and a square constellation (QAM 16, 64 . . . ) is used. The displacements $\Delta^k$, accordingly, can only take the values 0 and $\pm 1$, since the value $\pm 2$ can only be obtained for the virtual points of a cross constellation. The relative distance $\tilde{\mu}_k$ then complies with the following inequality:

$$0 \leq \tilde{\mu}_k \leq 1 + 1 + 7/8 + 7/8 < 31/8$$

and is accordingly coded with five bits, while with the same parameters the square euclidian distance is coded with nine bits ($\mu \leq 265/16 < 512/16$).

The complexity of such a decoder, which strongly depends on the number of bits necessary for representing the path lengths, and thus the branch lengths, is reduced thereby without adversely affecting the calculation accuracy, so that the performance level of the decoder can be retained.

Figure 7:
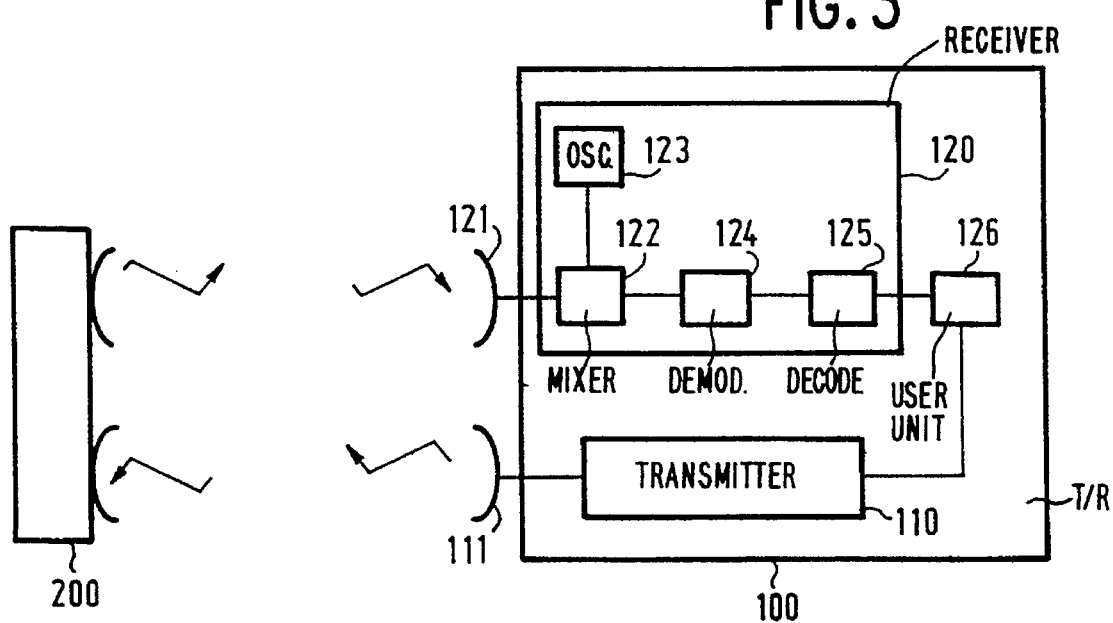
FIG. 7 represents a transmission system according to the invention.

FIG. 7 is a diagram showing the principle of a transmission system according to the invention. Such a system consists of two identical transmitter/receivers 100 and 200, of which only the transmitters/receiver circuit 100 is shown in detail in the Figure. This transmitter/receiver circuit 100 comprises a transmitter 110 and a receiver 120. The receiver 120 comprises a reception antenna 121 connected to a first input of a mixer circuit 122 of which a second input is connected to the output of a local oscillator 123. The output of the mixer circuit is connected to a demodulation circuit 124 which again is connected to a decoder 125 such as described with reference to FIG. 4. The information received, available at the output of this decoder 125, is supplied to a user unit 126.

This user unit 126 is also connected to the transmitter 110 to which it provides the information to be transmitted, the transmitter 110 in its turn being connected to a transmission antenna 111.

It is obvious that modifications are possible for the embodiments described above, especially the substitution of equivalent technical means, without departing from the scope of the invention. In particular, the chosen subdivision, the dimension of the original constellation, and the trellises used could be different. When the subdivision chosen is not the subdivision C, the calculation of the displacements $\Delta^k_X$ and $\Delta^k_Y$ will have to be modified accordingly, and these displacements may have integer values for the higher subdivisions in excess of 2, in absolute value, but they will remain low such that there are no consequences for the complexity of the decoder.

We claim:

1. A modem for receiving a series of transmitted digital symbols in a digital communication system wherein each of the transmitted symbols is encoded in accordance with a block-coded or trellis-coded 2-dimensional quadrature amplitude modulation (QAM) constellation of points corresponding to authorized code values, which constellation is divided into a plurality of subsets of points corresponding to authorized code values; said modem including a decoder for decoding the received symbols, which decoder comprises:

means for determining an authorized point in said constellation which is closest to a point therein corresponding to a received sample;

means for determining a source subset of said constellation to which said authorized point belongs;

means for determining a point closest to the received point in each of a plurality of subsets of said constellation other than said source subset; and means for calculating a branch length $\mu$ for each of said other subsets between the received point and an authorized point which is closest thereto;

said branch length $\mu$ being calculated as a relative distance given by the following function $\Im$:

$$\mu = \Im(|\Delta_i|, sgn(\Delta_i), sgn(E_i), |I_i|)$$

in which the index i indicates the abscissa (i=x) or the ordinate (i=y) of the quantity indicated, $|\Delta_i|$ represents the displacement between successive authorized points of said constellation, $E_i$ is an abscissa or ordinate error distance using the same index as for $\Delta_i$ between the received sample point and the authorized point which is closest thereto in said constellation, and Sgn() indicates the sign function.

2. The modem as claimed in claim 1, wherein the relative distance $\mu$ used is calculated from an expression of the type:

$$\tilde{\mu} = \sum_{i=x,y} |\Delta_i| \cdot (|\Delta_i| - sgn(\Delta_i) \cdot sgn(E_i) \cdot |E_i|)$$

3. The modem claimed in claim 1, wherein the relative distance $\mu$ is obtained by calculation of expressions of the type:

$$n(n \pm |E_i|)$$

in which n is a natural integer whose value is small in relation to the relevant subset of the constellation.

4. The modem claimed in claim 1, wherein the original constellation is subdivided into at most eight sub-sets, and the relative distance $\mu$ is obtained through calculation of expressions of the type:

$$(1\pm|E_i|)$$

when $|\Delta_i|$ is equal to 1, and through calculation of expressions of the type:

$$(2\pm|E_i|)$$

followed by a shifting of the result towards the bits of greatest weight when $|\Delta_i|$ is equal to 2.

5. The modem claimed in claim 1, wherein each of the coordinates of the error distance $E_i$ is coded in three bits.

* * * * *